(12) United States Patent
Shah et al.

(10) Patent No.: US 10,854,245 B1
(45) Date of Patent: Dec. 1, 2020

(54) TECHNIQUES TO ADAPT DC BIAS OF VOLTAGE REGULATORS FOR MEMORY DEVICES AS A FUNCTION OF BANDWIDTH DEMAND

(71) Applicant: Intel Corporation, Santa Clara, CA (US)

(72) Inventors: Setul M. Shah, Folsom, CA (US); William Sheung, Folsom, CA (US); Dhruval J. Patel, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/514,780

(22) Filed: Jul. 17, 2019

(51) Int. Cl.
*G11C 5/14* (2006.01)
*G11C 16/10* (2006.01)
*H02M 3/07* (2006.01)
*G05F 1/575* (2006.01)
*G11C 16/30* (2006.01)

(52) U.S. Cl.
CPC .............. *G11C 5/147* (2013.01); *G05F 1/575* (2013.01); *G11C 16/10* (2013.01); *G11C 16/30* (2013.01); *H02M 3/07* (2013.01)

(58) Field of Classification Search
CPC ......... G11C 5/147; G11C 16/10; G11C 16/30; G05F 1/575; H02M 3/07
USPC .......................... 323/280; 365/163, 185, 226
See application file for complete search history.

(56) References Cited

U.S. PATENT DOCUMENTS

| 6,456,557 | B1 * | 9/2002 | Dadashev | G11C 5/147 365/185.09 |
| 6,777,705 | B2 * | 8/2004 | Reinberg | H01L 45/06 257/2 |
| 7,362,163 | B1 * | 4/2008 | Raghavan | H02M 3/07 327/535 |
| 7,372,739 | B2 * | 5/2008 | Macerola | G11C 5/145 365/185.25 |
| 7,493,506 | B2 * | 2/2009 | Balasubramanian | G01K 7/015 326/38 |
| 10,168,758 | B2 * | 1/2019 | Suryanarayanan | G06F 1/3287 |
| 2009/0158071 | A1 * | 6/2009 | Ooi | G06F 11/30 713/340 |
| 2014/0064010 | A1 | 3/2014 | Barkley et al. | |
| 2014/0211553 | A1 * | 7/2014 | Lai | G11C 5/147 365/163 |
| 2014/0226417 | A1 * | 8/2014 | Lai | G11C 13/004 365/189.09 |

(Continued)

FOREIGN PATENT DOCUMENTS

WO 2015191860 A1 12/2015

OTHER PUBLICATIONS

Extended European Search Report for Patent Application No. 20162278.4, dated Sep. 18, 2020, 7 pages.

*Primary Examiner* — Yemane Mehari
(74) *Attorney, Agent, or Firm* — Compass IP Law, PC

(57) ABSTRACT

Techniques to adapt the DC bias of voltage regulators for memory devices as a function of bandwidth demand are described. In one example, a non-volatile memory device includes a plurality of voltage regulator slices, wherein outputs of the plurality of voltage regulators slices are tied together to provide a voltage to perform operations on the array. The voltage regulator slices can be enabled or disabled based on a signal from a memory controller, such as an indication of an upcoming change in bandwidth demand for a rank including the memory device.

17 Claims, 10 Drawing Sheets

(56) References Cited

U.S. PATENT DOCUMENTS

| | | | |
|---|---|---|---|
| 2014/0266118 A1* | 9/2014 | Chern | H02M 3/156 323/283 |
| 2015/0070041 A1* | 3/2015 | Song | G01R 31/3004 324/756.02 |
| 2019/0043594 A1 | 2/2019 | Zhao et al. | |
| 2019/0073020 A1 | 3/2019 | Mozipo | |

* cited by examiner

TECHNIQUES TO ADAPT DC BIAS OF VOLTAGE REGULATORS FOR MEMORY DEVICES AS A FUNCTION OF BANDWIDTH DEMAND

FIELD

The descriptions are generally related to memory, and more particularly, to techniques to adapt the DC bias of voltage regulators for memory devices as a function of bandwidth demand.

BACKGROUND

Memory resources have innumerable applications in electronic devices and other computing environments. Demand for smaller, faster, lower power, and higher density memory has led to the development of new memory technologies. During the development of new memory technologies, a variety of challenges may be encountered such as challenges related to the manufacturing process, infrastructure, reliability, and power.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1A:
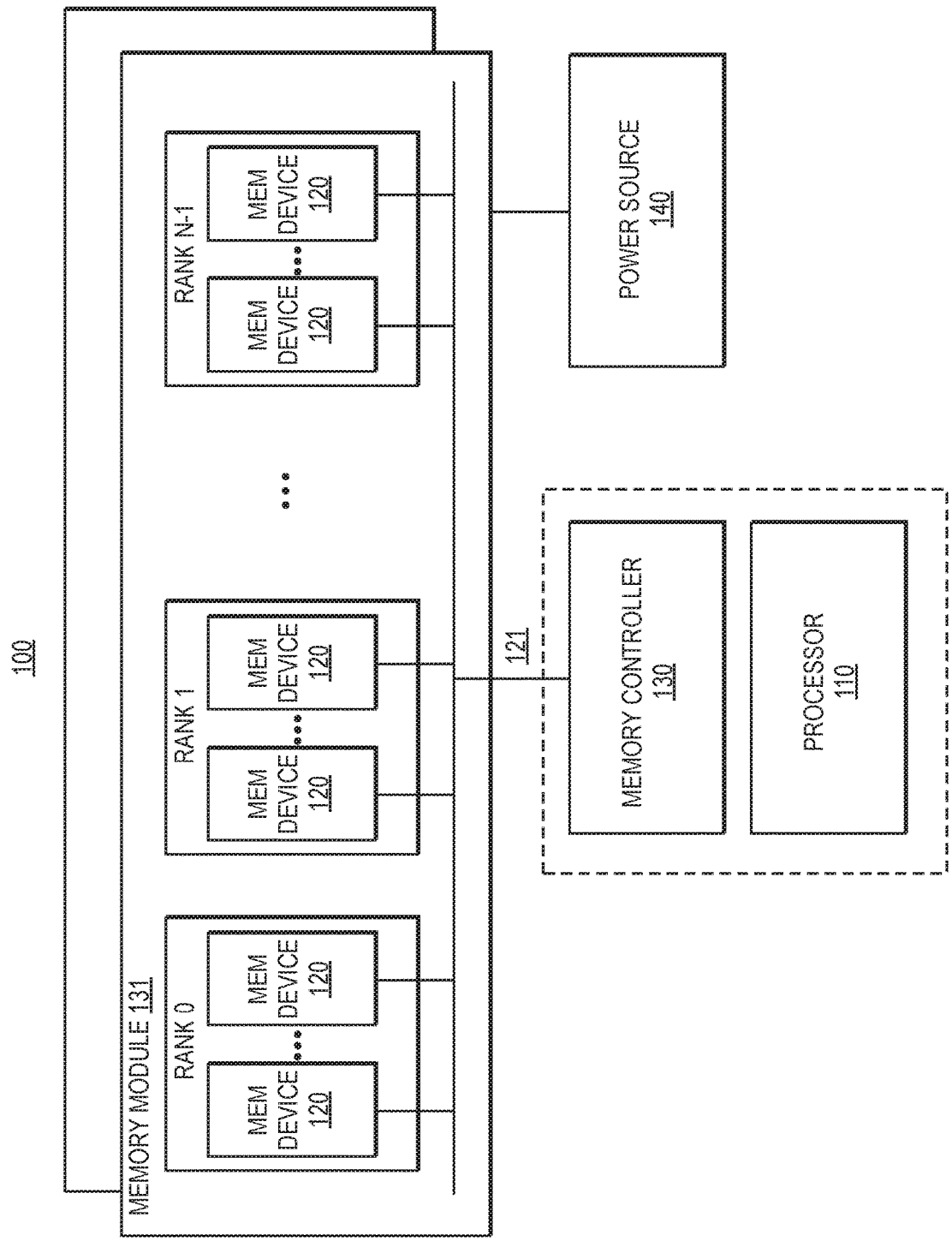
FIG. 1A is a block diagram of an example of a system.

Descriptions of certain details and implementations follow, including a description of the figures, which may depict some or all of the embodiments described below, as well as discussing other potential embodiments or implementations of the inventive concepts presented herein.

DETAILED DESCRIPTION

Adapting the DC bias of regulators for memory devices as a function of bandwidth demand can enable the optimization of background power and overall performance per power.

Conventionally, voltage regulators on memory devices are designed with DC (direct current) bias power to support the maximum bandwidth of the device. Such conventional voltage regulators cannot scale the DC bias power down if operating at a lower bandwidth. Thus, even for low bandwidth, conventional voltage regulators on memory devices consume a significant amount of power. One such example is a high voltage (HV) regulator for a three-dimensional (3D) crosspoint device, which may be organized as multiple partitions. A high voltage regulator on a 3D crosspoint die that supports the use of the maximum number of array partitions can lead to high power usage regardless of the actual concurrency of array partitions. The high power usage during low partition concurrency can be especially problematic for 3D crosspoint devices due to the high voltages that are typically used for array operations (e.g., read and write operations).

The conventional voltage regulators are also problematic in a multi-rank DIMM (dual in line memory module) system. For example, in a multi-rank system, memory accesses can be sent to one or more of the ranks. Consider an example with four ranks. In an example in which accesses are sent to all four ranks (e.g., serially sent to all ranks in successive order), each rank will be operating at only $1/4^{th}$ of the maximum bandwidth. In a conventional DIMM, even though each rank will be supporting only $1/4^{th}$ of the maximum bandwidth, each of the chips in the rank will be spending DC bias power for supporting the maximum bandwidth. This inefficiency is even more pronounced for DIMMs with a high number of dice. The high power usage may force the system to throttle down performance to stay within expected DIMM socket power limitations/envelope. Thus, conventional regulators for memory devices may result in poor performance metrics, such as bandwidth per power, especially in memory devices using high voltages for array operations and for multi-rank DIMMs.

In contrast, a memory device or die includes a plurality of voltage regulators with outputs that are tied together to provide a voltage to perform operations on the array. The memory device also includes logic to digitally enable or disable one or more of the voltage regulators based on a signal from a memory controller. For example, the memory controller provides an indication to the memory device (e.g., via a mode register write (MRW) command to program a mode of the memory device or other indication) of an anticipated change in bandwidth, which causes the memory device to enable or disable voltage regulators to meet the upcoming change in bandwidth demand. The memory controller then waits a predetermined time before sending commands to the memory device at the new bandwidth (e.g., at a new command stagger rate). Enabling or disabling voltage regulators based on the demand from the system enables significant reduction of scaling of power consumption, which can reduce or eliminate the need to throttle memory accesses in order to stay within the expected power range.

FIG. 1A is a block diagram of an example of a system. The system 100 includes components of a memory subsystem having one or more memory modules 131, each having one or more memory devices or dies 120. In one example, the memory modules 131 represent dual inline memory modules (DIMMs). In one example, the memory modules 131 represent other organization of multiple memory devices to share at least a portion of access or control circuitry, which can be a separate circuit, a separate device, or a separate board from the host system platform. A memory module 131 can include multiple memory devices 120, and the memory modules can include support for multiple separate channels to the included memory devices disposed on them. In another example, the memory devices 120 are disposed directly on a motherboard or host system platform (e.g., a PCB (printed circuit board) on which processor 110 is disposed) of a computing device.

Memory resources can be organized in various ways, such as separate channels, ranks, and banks of memory. Channels are independent control paths to storage locations within memory devices 120. Ranks refer to common locations across multiple memory devices (e.g., same row addresses within different devices). A rank typically includes multiple memory devices that share a chip select signal. Banks refer to arrays of memory locations within a memory device 120. A memory device typically includes multiple banks. A bank may also be referred to as a partition. In one example, banks of memory are divided into sub-arrays with at least a portion of shared circuitry (e.g., drivers, signal lines, control logic) for the sub-arrays. Sub-arrays may also be referred to as tiles. In the example illustrated in FIG. 1A, each memory module has N ranks, and each rank includes multiple memory devices 120.

The memory devices 120 include memory resources to store and provide data in response to operations of a processor 110. The system 100 receives memory access requests from a host or a processor 110, which is processing logic that executes operations based on data stored in the memory devices 120 or generates data to store in the memory devices 120. The processor 110 can be or include a host processor, central processing unit (CPU), microcontroller or microprocessor, graphics processor (GPU), peripheral processor, application specific processor, accelerator, or other processor, and can be single core or multicore.

The system 100 includes a memory controller 130, which represents logic to interface with memory devices 120 and manage access to data stored in the memory. The memory controller 130 may be integrated into the hardware of the processor 110 or may be standalone hardware separate from the processor 110. The memory controller 130 can be a separate circuit on a substrate that includes the processor. The memory controller 130 can be a separate die or chip integrated on a common substrate with a processor die (e.g., as a system on a chip (SoC)). In one example, the memory controller 130 is an integrated memory controller (iMC) integrated as a circuit on the processor die. In one example, at least some memory (e.g., memory devices 120) can be included on an SoC with the memory controller 130 and/or the processor 110.

The memory controller 130 is coupled to memory devices 120 via signal lines (e.g., one or more buses) 121. As used herein, coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

The system 100 includes power source 140, which can be a voltage source or regulator that provides power to the memory devices 120. The memory devices 120 can use the power available from the power source 140 as input to internal or on-die voltage regulators to apply voltages to perform access operations (e.g., read and write) on the memory cells of the memory devices 120.

Figure 1B:
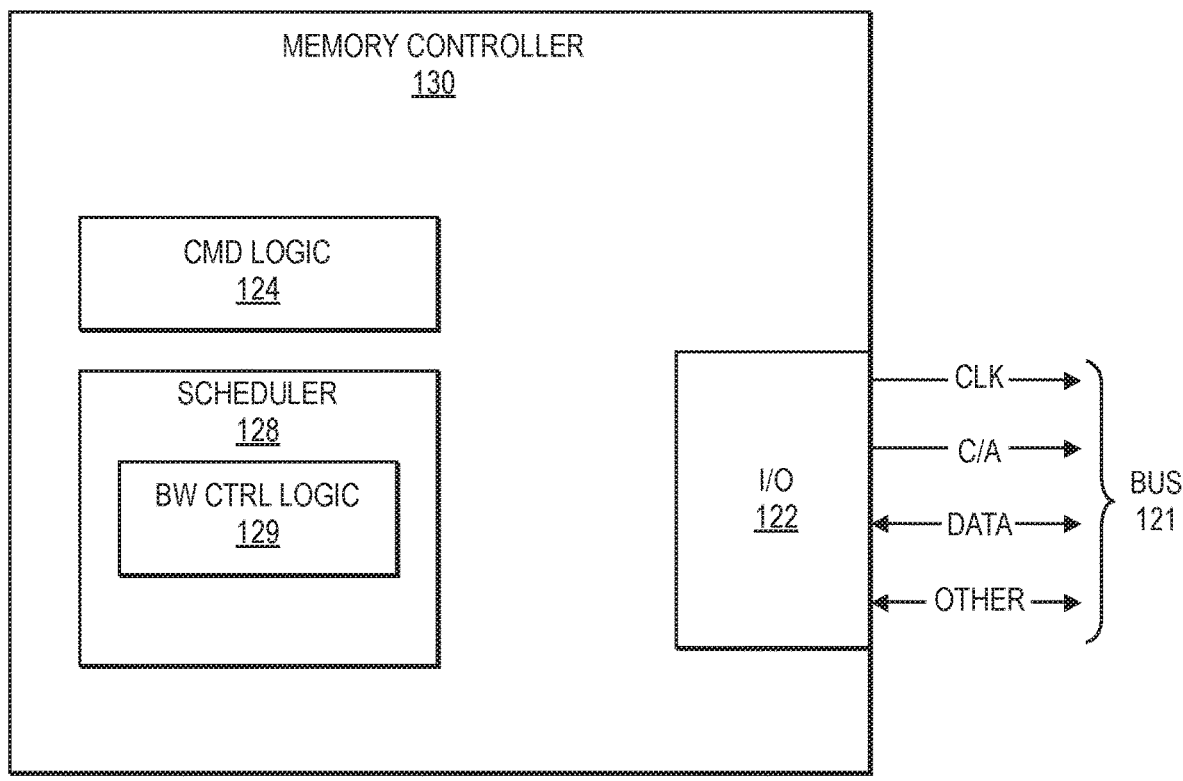
FIG. 1B is a block diagram of an example of a memory controller.

FIG. 1B is a block diagram of an example of a memory controller. The memory controller 130 represents one or more memory controller circuits or devices for system 100. The memory controller 130 represents control logic that generates memory access commands in response to the execution of operations by processor 110. The memory controller 130 accesses one or more memory devices 120.

The memory controller 130 includes input/output (I/O) interface logic 122 to couple to a system bus or a memory bus or both, such as a memory channel. The I/O interface logic 122 (as well as I/O interface logic 142 of memory controller 130, discussed below) can include pins, pads, connectors, signal lines, traces, or wires, or other hardware to connect the devices, or a combination of these. The I/O interface logic 122 can include a hardware interface. In one example, the I/O interface logic 142 includes at least drivers/transceivers for signal lines. Commonly, wires within an integrated circuit interface couple with a pad, pin, or connector to interface signal lines or traces or other wires between devices. The I/O interface logic 122 can include drivers, receivers, transceivers, or termination, or other circuitry or combinations of circuitry to exchange signals on the signal lines between the devices. The exchange of signals includes at least one of transmit or receive.

In the example illustrated in FIG. 1B, the bus 121 includes at least a clock signal (CLK) and signal lines to transmit command/address (CMD or C/A) information and data. In one example, independent channels have different clock signals, C/A buses, data buses, and other signal lines. The signal lines of the bus 121 between the memory controller 130 and the memory modules 131 may be unidirectional or bidirectional. In one example, the bus 121 includes command and write signal lines that include unidirectional lines for transmission of write and command data from the host to memory. In one example, the bus 121 includes read data signal lines that include unidirectional lines for transmission of read data from the memory to the host. In one example, the data bus can include bidirectional lines for read data and for write/command data. Based on the design of the system 100, or implementation if a design supports multiple implementations, the data bus can have more or less bandwidth per memory device 120. The bandwidth of the bus 121 refers to the maximum data transfer per second supported by the bus 121. In one example, the bandwidth refers to the maximum data transfer per second for the data signal lines between the memory controller and the memory devices. The bandwidth at which the memory devices 120 operate can be influenced by a number of factors, including the frequency of the clock and the interface size (e.g., number of data signal lines) of the memory devices 120.

The memory controller 130 includes command (CMD) logic 124, which represents logic or circuitry to generate commands to send to memory devices 120. For example, command logic 124 can generate commands such as write, read, mode register read and write, and other commands. Typically, the memory controller sends address information within or accompanying the command to indicate or select one or more memory locations where the memory devices should execute the command.

In one example, the memory controller 130 includes a scheduler 128 to schedule the sending of access commands to the memory devices 120 based on known timing parameters for read and write access for the memory device 120 or memory module 131. Known timing parameters can be those that are preprogrammed or otherwise preconfigured into system 100. Such parameters can be stored in memory 120 and accessed by memory controller 130. In one example, at least some parameters are determined by synchronization procedures.

The memory controller also includes logic 129 to control the bandwidth of one or more memory devices 120 coupled with the memory controller 130. The logic 129 can include hardware, firmware, software, or a combination. As mentioned above, the term bandwidth can refer to the rate of data transfer over a bus as impacted by clock speed and interface width. The term bandwidth can also refer to the rate of data output by the memory devices 120. The maximum bandwidth of a bus may be different than the bandwidth of a memory device. For example, the bandwidth of the memory device can be impacted by the stagger rate of commands sent from the memory controller 130 to the memory device 120. The stagger rate of commands is the rate that commands are sent over the command bus or queued for a memory device or rank. Thus, a low stagger rate has a higher spacing or separation between commands sent by the memory controller to a memory device or rank, and a high stagger rate has a lower spacing between commands. In a multi-rank system, the number of ranks can impact the stagger rate. In one example, the maximum stagger rate to a memory device is achieved by sending back-to-back commands to a memory device. The rate of commands sent to the memory device 120 impacts the rate at which commands are serviced and thus impacts the bandwidth or rate at which data is provided by the memory device 120. The bandwidth of a memory device can also be impacted by the number of partitions that are being accessed concurrently. Higher partition concurrency results in higher bandwidth and lower partition concurrency results in lower bandwidth.

In one example, the bandwidth control logic 129 determines what the upcoming bandwidth demand is for a memory device 120. For example, the logic 129 can monitor the mix of memory accesses and determine how many memory accesses are targeting a particular memory device. Based on the future or anticipated bandwidth demand, the memory controller can communicate to the memory devices that the memory usage will be higher or lower. Communicating an anticipated change in bandwidth can involve, for example, programming a mode register on the memory device. For example, the memory controller can send a mode register write command to the memory device to change a mode (e.g., a high or low power mode, or a high or low bandwidth mode, etc.). The memory device can then scale its power in response to the anticipated change in bandwidth. After communicating the upcoming change in bandwidth, the memory controller waits some predetermined time to enable the memory device to adjust its power, and then sends memory access requests at the new stagger rate. By communicating the future change in bandwidth to the memory device, the memory device can enable or disable one or more of its voltage regulators to optimize power consumption. Note that although in the illustrated example, the logic 129 to control the bandwidth is included in the scheduler 128, the logic 129 can be separate from the scheduler 128.

Figure 1C:
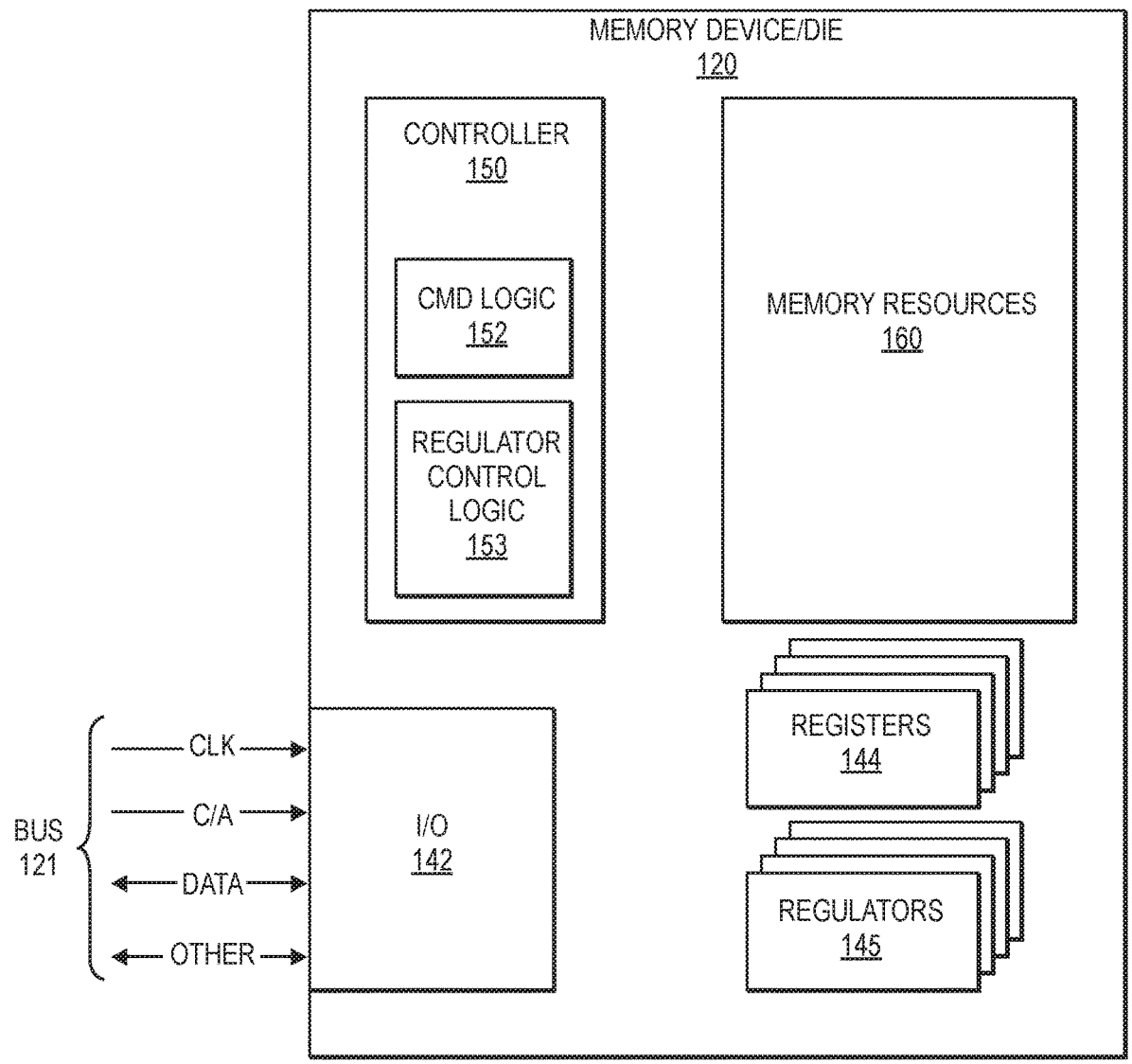
FIG. 1C is a block diagram of an example of a memory device.

FIG. 1C is a block diagram of an example of a memory device 120. The memory device may include volatile memory, non-volatile memory, or a combination of volatile and non-volatile memory. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM).

In addition to, or alternatively to, volatile memory, in one embodiment, reference to memory devices can refer to a nonvolatile memory device whose state is determinate even if power is interrupted to the device. In one embodiment, the nonvolatile memory may be byte or block addressable. Block addressable or byte addressable nonvolatile memory may include, but are not limited to, 3D cross-point memory, memory that uses a chalcogenide material and/or phase change material, multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) memory that incorporates memristor technology, or spin transfer torque MRAM (STT-MRAM), or a combination of any of the above, or other non-volatile memory types.

Descriptions herein referring to a "RAM" or "RAM device" can apply to any memory device that allows random access, whether volatile or nonvolatile. "DRAM" refers to dynamic RAM and is volatile. The memory device can refer to the die itself, to a packaged memory product that includes one or more dies, or both.

The memory devices 120 each include memory resources 160. Memory resources 160 represent arrays of memory cells or locations to store data. Typically, memory resources 160 are managed as rows of data, accessed via wordline (rows) and bitline (individual bits within a row) control.

In one example, each memory device 120 is a separate memory die. Each memory device 120 includes I/O interface logic 142. The I/O interface logic 142 enables the memory devices to interface with memory controller 130. The I/O interface logic 142 can be similar to the I/O interface logic 122 described above.

In one example, memory devices 120 include one or more registers 144. The register 144 represents one or more storage devices or storage locations that provide configuration or settings for the operation of the memory device. In one example, the register 144 can provide a storage location for memory device 120 to store data for access by memory controller 130 as part of a control or management operation. In one example, the register 144 includes one or more mode registers. In one example, the register 144 includes one or more multipurpose registers. Programming the register 144 to different values can configure memory device 120 to operate in a different mode. Settings of register 144 can indicate configuration for I/O settings, timing, termination or ODT (on-die termination), driver configuration, or other I/O settings. In one example, the registers 144 include one or more registers that affect how many regulators 145 are enabled or disabled. In one example, one or more registers indicate a mode of the memory device, such as a mode affecting power, concurrency (e.g., of access to banks/partitions), or bandwidth. The terms "low bandwidth mode" and a "high bandwidth mode" are used herein to describe one or more modes/register fields that affect the number of voltage regulators that are enabled, however, other terms may be used (e.g., "economy (eco) mode" or "low power mode" to describe a lower bandwidth mode and "boost mode" or "high power mode" to describe a higher bandwidth mode). Although the examples refer to two modes (e.g., a high and low bandwidth mode), more than two mode may be used to achieve a finer gradient of control regarding bandwidth and power.

The memory device 120 includes a controller 150, which represents control logic within the memory device to control internal operations within the memory device. The controller 150 can be referred to as an internal controller or as control logic. In one example, the controller 150 decodes commands sent by the memory controller 130 and generates internal operations to execute or satisfy the commands. In one example, the controller 150 of memory device 120 includes command logic 152 to receive and decode command and address information received via the I/O circuitry 142 from the memory controller 130. Based on the received command and address information, the controller 150 can control the timing of operations of the logic and circuitry within memory device 120 to execute the commands. The controller 150 can determine what mode is selected based on the register 144, and configure the internal execution of operations for access to memory resources 160 or other operations based on the selected mode. The controller 150 generates control signals to control the routing of bits within memory device 120 to provide a proper interface for the selected mode and direct a command to the proper memory locations or addresses.

The technique employed by the controller 150 to read and write to memory depends on the memory technology of the memory resources 160. For example, in a 3D crosspoint device, reads from and writes to the memory cell array are performed by applying one or more voltages (e.g., voltage pulses) to the memory cells. One or more voltage levels may be provided by the power source 140 to the regulators 145 for performing memory access operations. In one example, a memory cell can be read by applying a voltage drop to the memory cell to determine the state of the memory cell. For example, sense circuitry (e.g., sense amps) detect an electrical response from a cell to an applied read voltage. In one such example, the state of the memory cell is determined based on whether the cell conducts current over a threshold in response to the applied read voltage.

In one example, a memory cell can also be written to by applying a voltage pulse to the memory cell. In some memory technologies (e.g., in some 3D crosspoint memory technologies), the polarity of the programming pulse affects the state that the cell is programmed to. For example, programming in forward polarity will put the cell in one state (e.g., a lower threshold state) and programming in reverse polarity will put the cell in the other state (e.g., a higher threshold state). In one such example, the controller 150 applies a pulse that is sufficient to trigger the storage material to "threshold" or transition from one stable state to another. Other memory access techniques may be used for other memory technologies. Depending on implementation, the circuitry to perform memory reads and writes can be common to multiple banks or partitions of memory arrays or can be duplicated for each memory bank or partition.

Regardless of memory technology, the performance of memory reads and writes consumes power. Conventional memory dies include a single voltage regulator to supply the voltages to select and read from or write to a memory cell. In memory die designs with a single voltage regulator, the power can be scaled by changing the DC bias current with analog circuitry. However, changing the DC bias current to a single big regulator typically requires a lot of time. For example, after changing the bias current, there is a delay time before the regulator can be used to ensure that the regulator is stable at the new bias current. The significant delays involved with changing bias current to a single regulator make it impractical to adjust DC bias current in this way during operation of the memory device.

In contrast, the memory device 120 includes multiple smaller regulators 145 that can be digitally enabled or disabled to adjust power. In one example, the controller 150 includes logic 153 to control how many regulators 145 to enable or disable based on one or more registers 144. The number of regulators 145 that are enabled or disabled can thus be adjusted to scale power consumption with the memory access load. As mentioned above, the memory can be divided into partitions or banks, which may or may not be concurrently accessed. When the partitions are concurrently accessed, more power is needed, more of the regulators 145 are enabled. When partitions are not concurrently accessed, fewer of the regulators 145 are enabled.

Figure 1D:
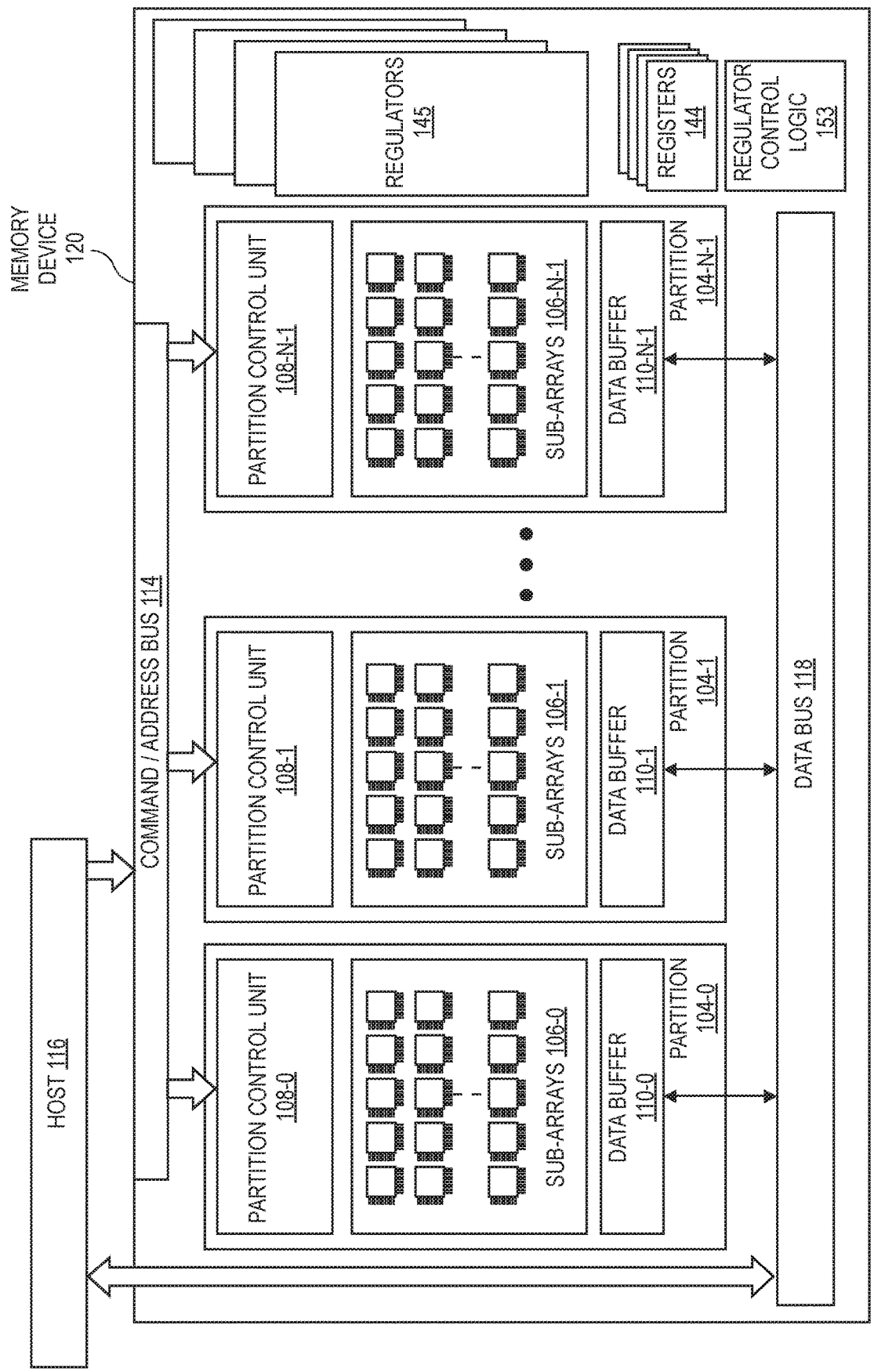
FIG. 1D is a block diagram of a memory device organized as multiple partitions.

FIG. 1D is a block diagram of a memory device organized as multiple partitions. In the illustrated example, the memory device includes N partitions 104-0-104-N-1. Each of the partitions 104-0-104-N-1 include a plurality of sub-arrays. The sub-arrays 106-0-106-N-1 may also be referred to as tiles. In the illustrated example, each of the sub-arrays is a crosspoint memory array. In one example, each sub-array includes a plurality of wordlines and bitlines to access individual memory cells in the sub-array. In one example, each sub-array can access one memory cell at a time and has a 1-bit bandwidth. In one such example, each partition has the additive bandwidth of the sub-arrays. For example, a partition with 128 sub-arrays may have a bandwidth of 128 bits.

In the example illustrated in FIG. 1D, each partition includes a partition control unit. The partition control unit is coupled with the sub-arrays of that partition. The partition control units 108-0-108-N-1 include logic to receive command and address information from the command/address bus 114 and perform local memory accesses on sub-arrays of a partition. In the illustrated example, the partition control units receive commands and address information from the host 116. The host 116 can include, for example, a processor, a memory controller, or both. In one example, logic between the host and the partitions can serve as an interface between a host and a memory core (e.g., a memory core including the partitions 104-0-104-N-1) that can differ in terms of timing, expected latencies, expected memory addressing, etc. In the illustrated example, each partition also includes a data buffer. The data buffers 110-0-110-N-1 buffer data to and from the data bus 118. Thus, in the illustrated example, each partition can operate independently and concurrently.

Although all the partitions may operate concurrently, the memory device 120 can be configured to access fewer than all partitions concurrently. Operating the memory device 120 with maximum partitions results in a high bandwidth, but also a high power consumption. Operating with fewer than maximum partitions results in a lower bandwidth and lower power consumption. The voltage regulators 145 are shared amongst the partitions 104-0-104-N-1, and thus the demand on the voltage regulators 145 is higher when more partitions are concurrently operating (e.g., performing memory accesses). As mentioned briefly above, conventional memory devices included one large voltage regulator that provided sufficient power for the maximum bandwidth of the device. In contrast, the memory device 120 includes multiple voltage regulators 145 that may be digitally added or subtracted based on the bandwidth demand for the memory device 120.

Figure 2:
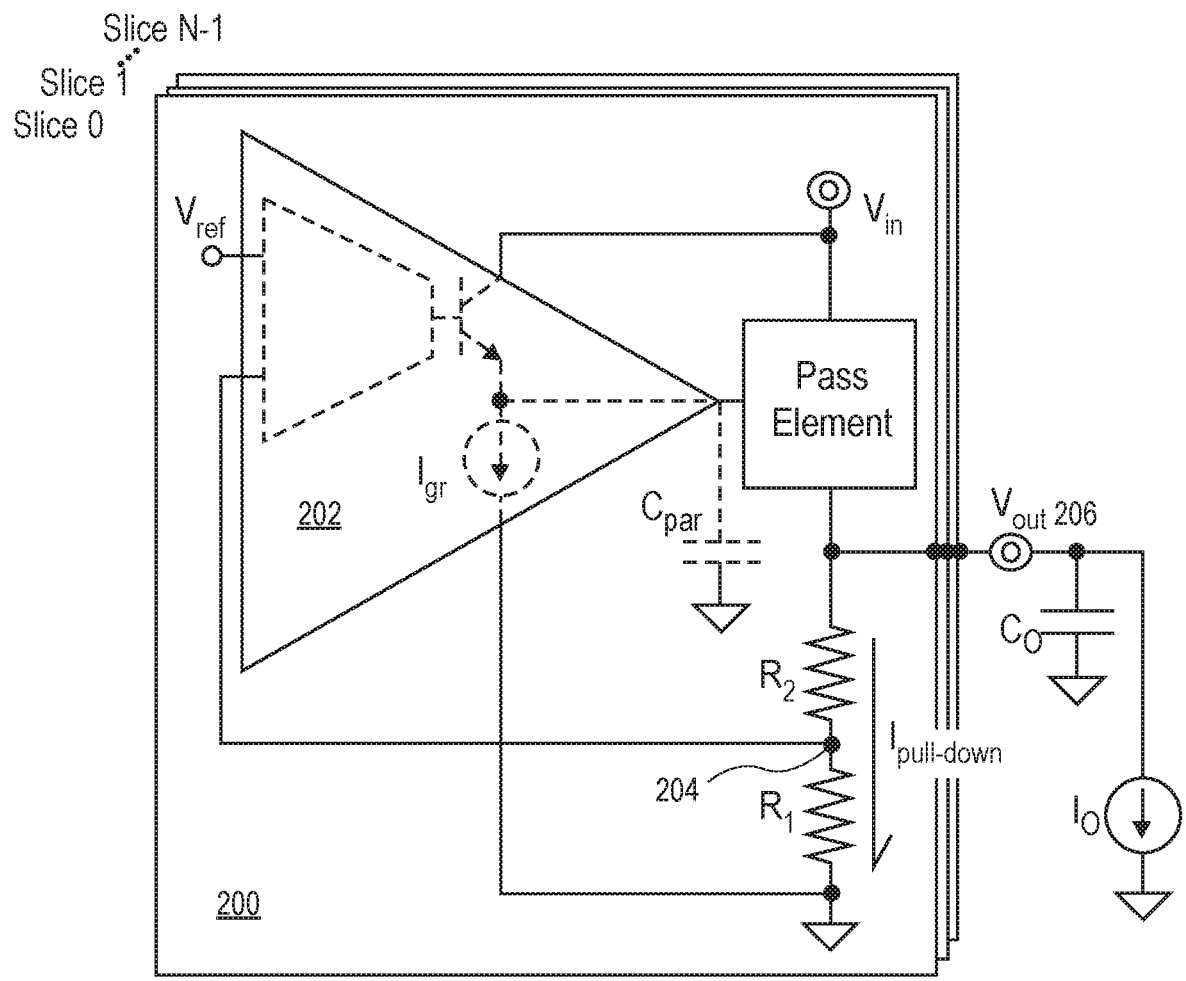
FIG. 2 illustrates an example of multiple regulators in parallel.

FIG. 2 illustrates an example of multiple regulators in parallel. In the illustrated example, each regulator is a "slice." The illustrated example includes N slices. The regulator slices may be the same as, or similar to, the voltage regulators 145 of FIGS. 1A, 1C, and 1D. The output of each of the regulator slices are shorted together at an output node 206. In the illustrated example, each slice represents one voltage regulator. The slice 200 shows a circuit diagram of one possible voltage regulator design, however, any suitable regulator design may be used. In one example, each of the slices includes the same regulator design (e.g., the slices are identical voltage regulators). Thus, in one example, each slice includes an amplifier, such as the amplifier 202 of slice 200. The amplifier 202 uses a negative feedback loop to output a constant voltage Vout based on an unregulated voltage input (Vin), a reference voltage (Vref), and a circuit of passive elements. In the illustrated example, the voltage at node 204 in the voltage divider formed from resistors R1 and R2 is fed to the negative input of the amplifier 202. Other voltage regulator designs may be used. The outputs of each slice are physically tied together (e.g., at node 206). Thus, the output voltage of the slices is Vout and the output current is Io.

In one example, each slice is optimized for a fraction of the maximum bandwidth or stagger rate. In one such example, for a memory module with X ranks, one voltage regulator (e.g., one slice) provides power sufficient for 1/Xth of the maximum bandwidth of the memory device. Thus, the optimum number of regulators can be added (e.g., enabled) to provide sufficient but not excessive power. In one example, the phase margin does not degrade as slices are enabled or disabled in parallel because the gain margin and capacitive load (Co) remains the same for each slice and unity bandwidth is proportional to gain margin and capacitive load.

Figure 3:
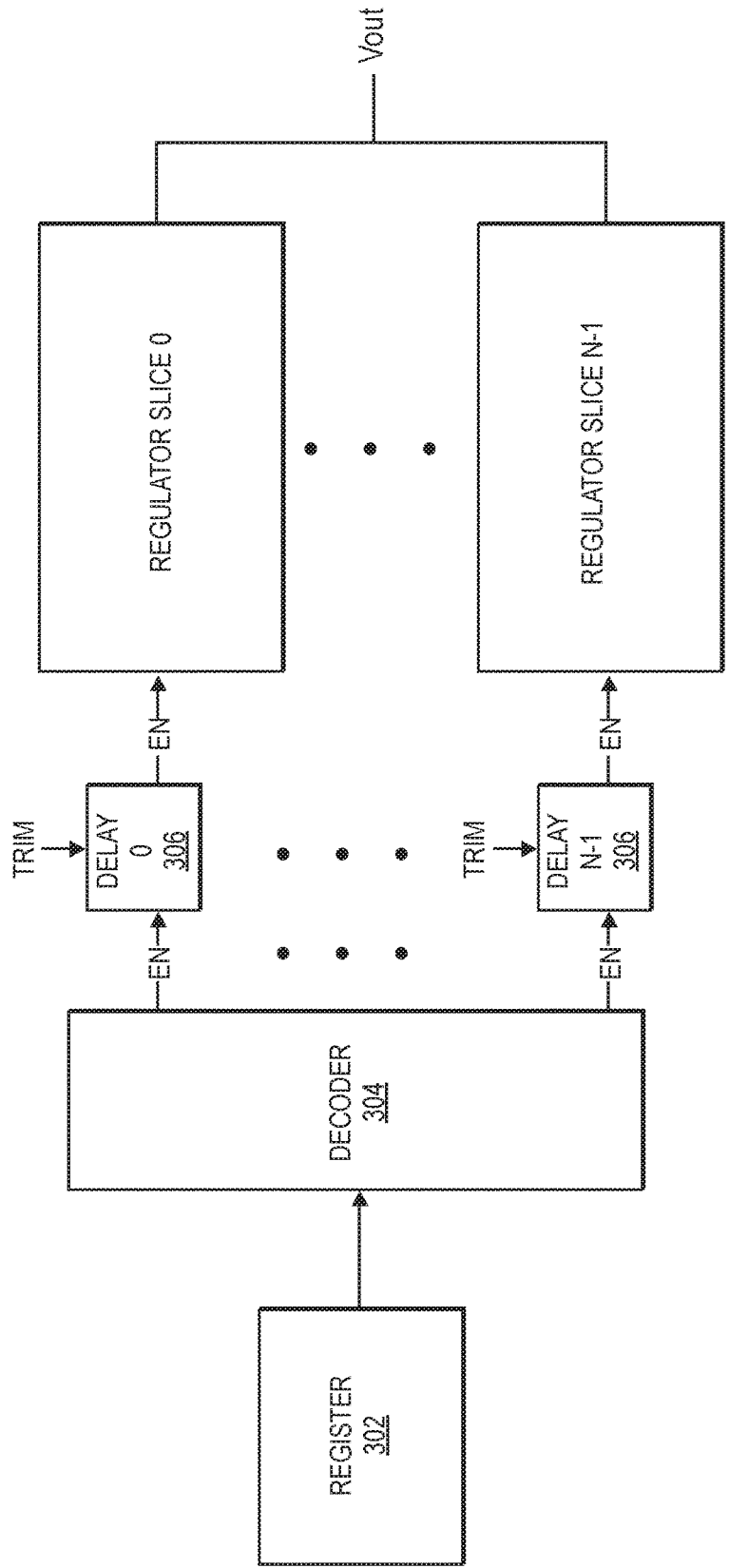
FIG. 3 illustrates a block diagram of voltage regulator control logic.

In one example, the rate of enabling or disabling voltage regulators is controlled to ensure a smooth transition. Controlling the rate of enabling or disabling voltage regulators can ensure that output specifications are not violated for ongoing partition reads and writes. FIG. 3 illustrates a block diagram of voltage regulator control logic. The control logic 153 of FIGS. 1C and 1D may include one or more of the logic blocks or components of FIG. 3.

FIG. 3 illustrates N regulator slices. The regulator slices can be the same as, or similar to, the regulator slices illustrated in FIG. 2. The regulator slices can be connected in parallel with outputs coupled together to output a voltage Vout, as illustrated in FIG. 2. Referring again to FIG. 3, each voltage regulator has an input to receive an enable or disable signal (illustrated in FIG. 3 as "EN"). In one example, the enable signals are based on a mode, setting, or other indication from the memory controller. In one such example, the register 302 stores a value regarding how many regulator slices are to be enabled or disabled. For example, the register 302 stores a low bandwidth mode in which fewer regulators are enabled and a high bandwidth mode in which more regulators are enabled.

The value stored in the register 302 is fed into a decoder 304. The decoder 304 includes logic to output signals for enabling or disabling one or more of the regulators based on the input from the register 302. For example, for a first register value, the decoder outputs signals to enable all the regulators, and for a second register value, the decoder outputs signals to disable one or more of the regulators. In one example, a write to the register 302 to indicate a transition to a high power or high bandwidth mode causes the decoder to enable one or more regulators, and a write to the register 302 to indicate a transition to a low power or low bandwidth mode causes the decoder to disable one or more registers. Although FIG. 3 illustrates an example in which all the regulator slices can be enabled or disabled, other examples may enable or disable only a portion of the regulators. For example, one regulator slice may always be enabled, while the other regulator slices may be enabled or disabled in accordance with bandwidth demand.

In the example illustrated in FIG. 3, the enable signals output by the decoder are fed into delay elements 306. The delay elements may include active or passive delay elements to introduce a delay in a signal. In one example, the delay elements are "trimmable" or programmable with an input signal "TRIM". The input signal TRIM may be based on one or more register settings or other signals. The delay elements enable a staggering of the enablement/disablement of the regulator slices. For example, if the register 302 is programmed to a new value that triggers a change in the output of the decoder 304, the change to the enable/disable signals can be staggered so that the regulator slices are not enabled or disabled all at once. For example, the regulators can be enabled or disabled one at a time (e.g., one regulator is disabled or enabled before another regulator receives the change in the enable/disable signal). Thus, the one or more of the regulators can be enabled or disabled at a controlled rate.

Figure 4:
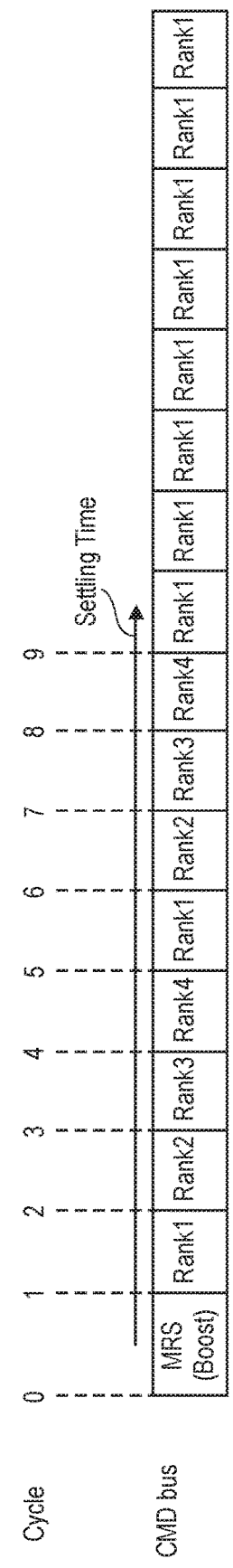
FIG. 4 illustrates one example of commands sent from a memory controller to a memory device or rank of memory devices.

FIG. 4 illustrates one example of commands sent from a memory controller to a rank of memory devices. The example illustrated in FIG. 4 assumes there are four ranks, each rank including multiple memory devices. FIG. 1A, discussed above, illustrates one example of multiple ranks, each rank including multiple memory devices.

Referring to FIG. 4, the example begins in a mode in which the ranks are operating at less than maximum bandwidth (e.g., a low bandwidth mode). In the low bandwidth mode, at least one or more voltage regulators on the memory devices are disabled, which enables lower power consumption. At cycle 0, the memory controller sends a command (e.g., MRS (mode register set) command) to program a register to enter a higher power or higher bandwidth mode. In the illustrated example, the memory controller sends the MRS command to devices on rank 1. For a typical memory module example there is only one chip select per rank, so the MRS command would be common for all die on the rank. A transition from the low bandwidth mode to the high bandwidth mode causes one or more voltage regulators on the memory device to be enabled.

After sending the command to enter the high bandwidth mode, the memory controller waits for a predetermined settling time before changing the stagger rate of commands to a memory device or rank. For example, at cycle 1, the memory devices of ranks 1-4 are still in the low bandwidth mode because the settling time delay has not passed. Therefore, the memory controller sends a command to each rank every four cycles (because there are four ranks). Specifically, the memory controller sends a command to rank 1 in cycle 1, a command to rank 2 in cycle 2, a command to rank 3 in cycle 3, and a command to rank 4 in cycle 4, and so forth. After the settling time delay has passed, the memory devices of rank 1 have entered the high bandwidth mode and have therefore enabled one or more voltage regulators. The memory controller can therefore send back-to-back commands (i.e., commands in every cycle) to the rank 1, and the voltage regulators on the memory device of rank 1 will have the power capacity to handle the burst of commands. If the memory controller determines that the bandwidth load for rank 1 has decreased below some threshold, the memory controller can send another mode register set command to cause the devices on rank 1 to transition to a low bandwidth mode. In response to the transition to the low bandwidth mode, the memory device will enable one or more voltage regulators.

Figure 5:
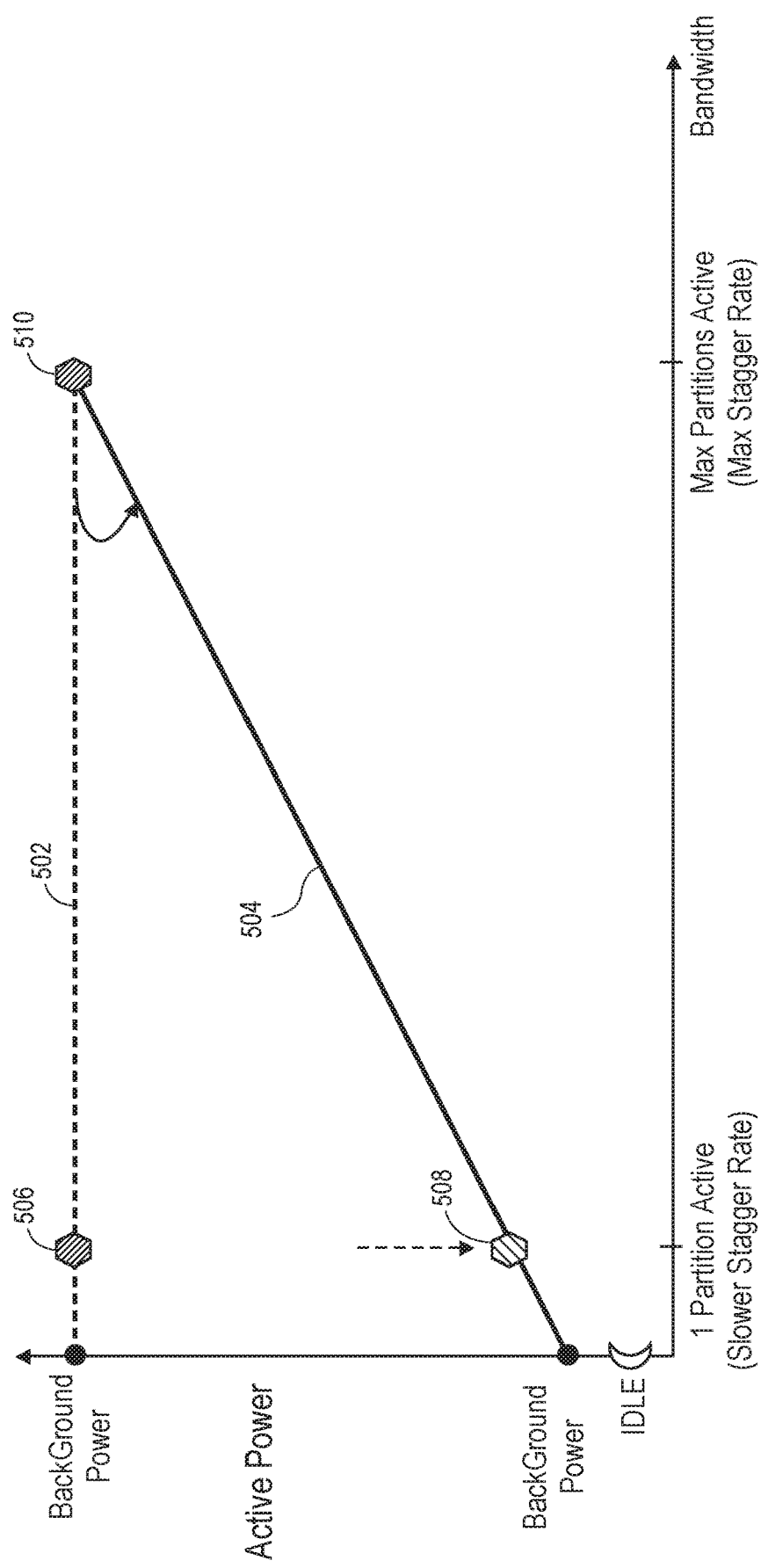
FIG. 5 is a graph illustrating an example of power usage per bandwidth.

FIG. 5 is a graph illustrating an example of power usage per bandwidth. The graph in FIG. 5 shows power for both memory devices with conventional voltage regulators (line 502) and for memory devices that include voltage regulators that can be digitally added or subtracted based on bandwidth demand (line 504). The x-axis represents bandwidth of a memory device. For the same input frequency, different datapoints on the x-axis indicate a different command stagger rate (e.g., commands are being queued at a higher or lower rate for a device or rank). In the illustrated example, at the maximum command stagger rate the maximum number of partitions are active. For example, referring to FIG. 1D, the maximum number of partitions 104-0-104-N−1 are active at the maximum stagger rate. At a slower stagger rate, fewer partitions (e.g., 1 partition or some other number of partitions that is less than the maximum) are active.

The y-axis represents active power (e.g., power when the device is receiving and servicing read and write commands). For example, the active power can be representative of the power consumed by the voltage regulators (e.g., high voltage regulators) on the memory device for applying voltages for reading and writing memory cells. As explained above, conventional memory devices include a single large voltage regulator that results in approximately the same power consumption regardless of the bandwidth of the device (e.g., regardless of the number of partitions that are concurrently being accessed). Thus, the power for conventional memory devices is shown as line 502 and is the same when one partition is active (at 506) as when maximum partitions are active (at 510). In contrast, voltage regulators slices that can be digitally added or subtracted as a function of bandwidth can result in significantly better power usage, as shown by line 504. The power consumption for the scalable voltage regulators described herein is lower when one partition is active (at 508) and higher when maximum partitions are active (at 510). In one example, the power usage of the device at the maximum partition concurrency is no higher than for conventional devices, and the power usage for minimum partition concurrency approaches background power usage when the device is idle. Thus, the power can be dynamically adjusted as bandwidth demand scales up or down by adding or subtracting voltage regulators in response to a signal from the memory controller.

Figure 6:
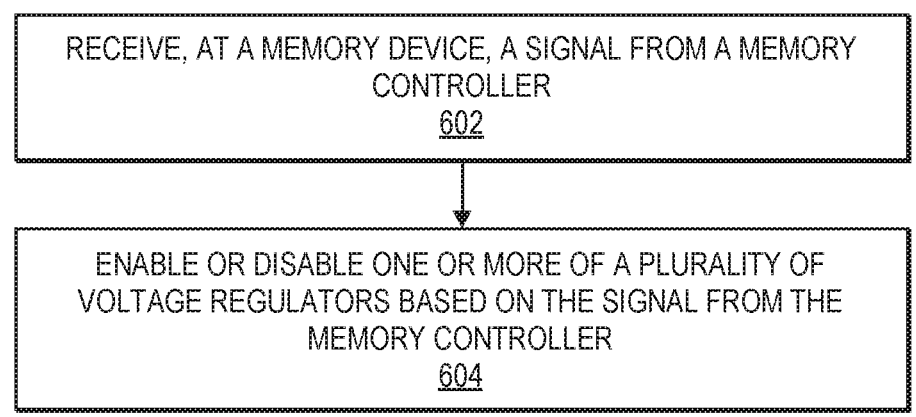
FIGS. 6-8 are flow charts of examples of methods of adjusting power in response to bandwidth demand.
Figure 7:
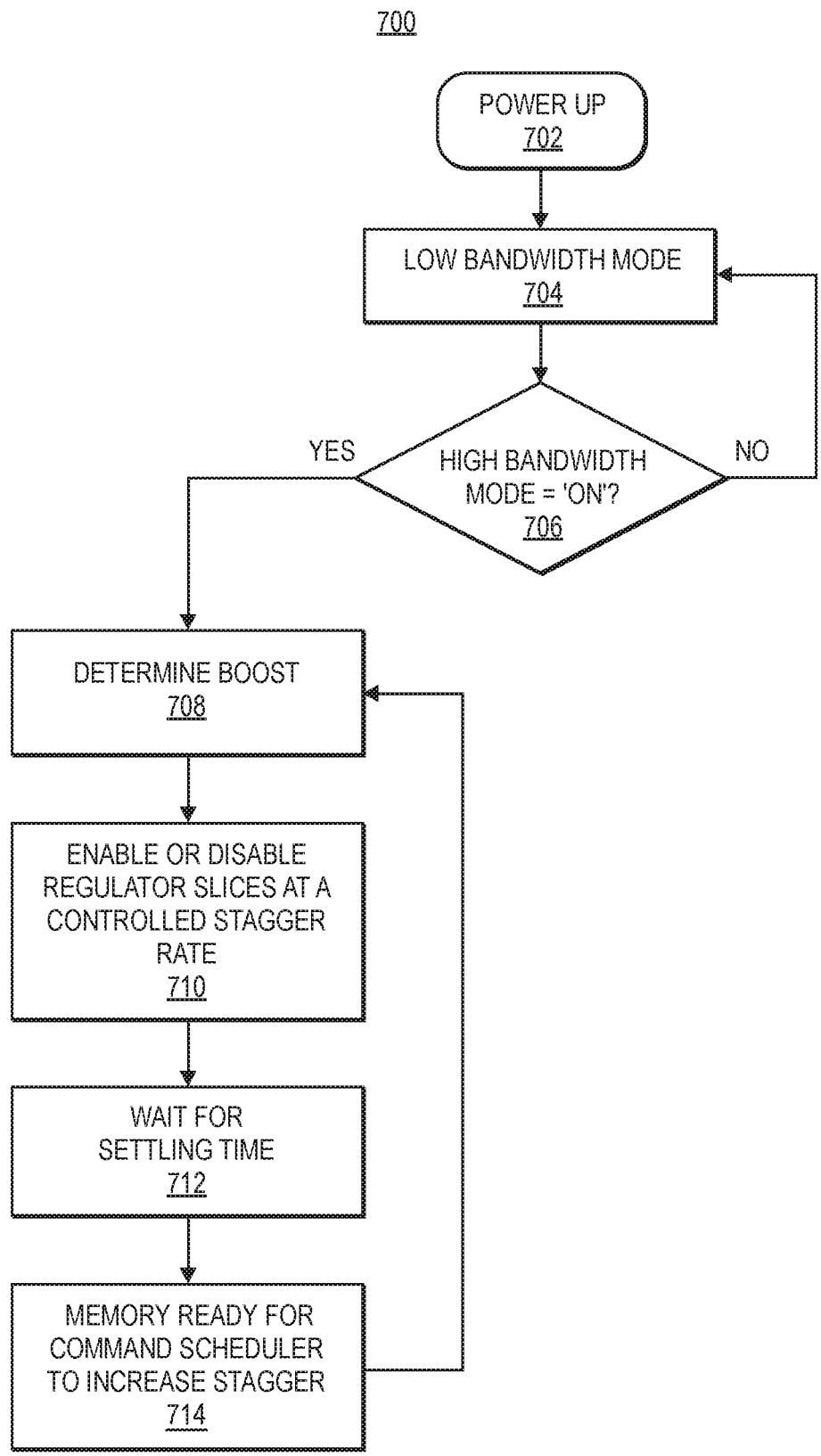
Figure 8:
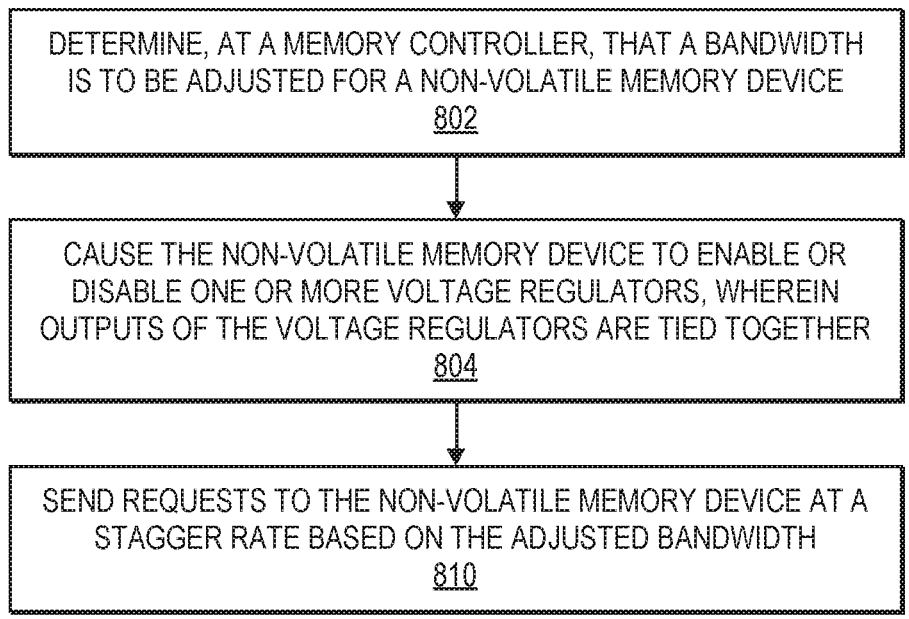

FIGS. 6-8 are flow charts of examples of methods of adjusting power in response to bandwidth demand. The flow charts of FIGS. 6 and 7 are examples of methods performed at or by a memory device (e.g., the memory devices 120 of FIGS. 1A-1D). In one example, control logic on the memory device (e.g., the controller 150, regulator control logic 153, etc.) performs some or all of the operations of the methods of FIGS. 6 and 7. The flow chart of FIG. 8 is an example of a method performed at or by a memory controller (e.g., the memory controller 130 of FIGS. 1A-1B). In one example, control logic on the memory controller (e.g., the scheduler 128, bandwidth control logic 129, etc.) performs some or all of the operations of the method of FIG. 8.

Turning first to FIG. 6, the method 600 begins with receipt, at a memory device, of a signal from a memory controller, at 602. In one example, the signal from the memory controller includes an indication of an anticipated change in bandwidth for the non-volatile memory device or a rank including the non-volatile memory device. In one example, the indication of the anticipated change in bandwidth includes an anticipated change in a stagger rate of commands to be sent to the non-volatile memory device from the memory controller. The indication of the anticipated change in bandwidth may indicate a change in the concurrency of active partitions on the memory device. Receipt of the signal could include, for example, receipt of one or more commands, such as the mode register set command discussed above with respect to FIGS. 3 and 4. However, other types of commands or signals may also be received from the memory controller.

After receipt of the signal from the memory controller, the memory device then enables or disables one or more of a plurality of voltage regulators based on the signal, at 604. In one example, the memory device includes logic to enable one or more of the plurality of voltage regulators in response to a write to the register to indicate a transition to a high power or high bandwidth mode. Similarly, in one example, one or more of the plurality of voltage regulators are disabled in response to a write to the register to indicate a transition to a low power or low bandwidth mode.

FIG. 7 is also a flow chart of a method to be performed by or at a memory device. The method 700 begins with power up of the memory device, at 702. In the illustrated example, the memory device is initialized to operate at a low bandwidth mode, at 704. A number of regulator(s) are enabled in the low bandwidth mode. As long as the mode is not changed, the same number of regulators continue to be enabled, 706 NO branch. If a signal triggers the memory device to transition to a high bandwidth mode, 706 YES branch, the memory device determines how much boost is needed, at 708. In one example, the memory device determines how many voltage regulators to enable or disable. For example, referring to FIG. 3, input to a decoder 304 can determine which regulator slices to enable or disable.

Referring again to FIG. 7, voltage regulator slices are enabled or disabled at a controlled stagger rate, at 710. The stagger rate can be controlled via delay elements on the enable signal lines, as mentioned above with respect to FIG. 3. After a predetermined settling time, at 712, the memory device is ready for the command scheduler on the memory controller to increase the command stagger rate, at 714.

FIG. 8 illustrates an example of a method to be performed by or at a memory controller. The method 800 begins with determining that a bandwidth is to be adjusted for a non-volatile memory device, at 802. The determination of whether to adjust the bandwidth of a memory device or rank and be based on, for example, the number of upcoming commands to targeting the device or rank relative to other devices or ranks. The scheduler of the memory controller typically knows what the upcoming requests are from host, and therefore what bandwidth is needed to access the memory component. The memory controller can then communicate that bandwidth change to the memory device and cause the memory device to enable or disable one or more voltage regulators, at 804. For example, the memory controller can send one or more commands (or other signals) to the memory device to communicate the upcoming bandwidth adjustment. After a predetermined delay after programming the register, the memory controller can then send requests to the non-volatile memory device at a stagger rate based on the adjusted bandwidth, at 810.

Thus, the power can be dynamically scaled with communication from the memory controller and voltage regulators on the memory device that can be enabled or disabled based on the indication from the memory controller.

Figure 9:
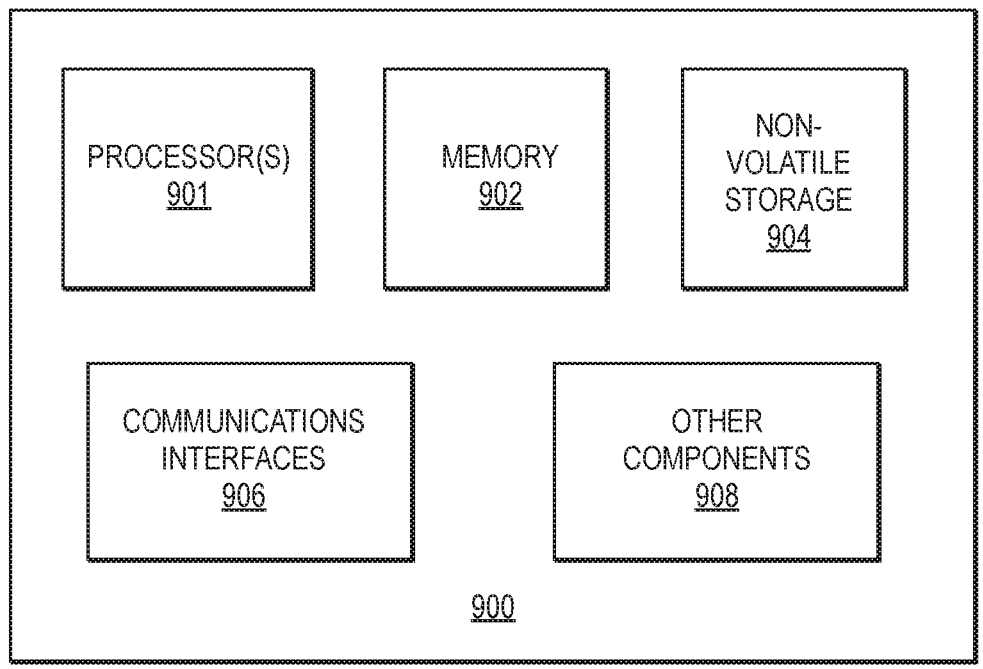
FIG. 9 provides an exemplary depiction of a computing system.

FIG. 9 provides an exemplary depiction of a computing system 900 (e.g., a smartphone, a tablet computer, a laptop computer, a desktop computer, a server computer, etc.) in which techniques to adapt the DC bias of memory device voltage regulators can be implemented. As observed in FIG. 9, the system 900 may include one or more processors or processing units 901. The processor(s) 901 may include one or more central processing units (CPUs), each of which may include, e.g., a plurality of general-purpose processing cores. The processor(s) 901 may also or alternatively include one or more graphics processing units (GPUs) or other processing units. The processor(s) 901 may include memory management logic (e.g., a memory controller) and I/O control logic. The processor(s) 901 can be similar to, or the same as, the processor 110 of FIG. 1A.

The system 900 also includes memory 902 (e.g., system memory), non-volatile storage 904, communications interfaces 906, and other components 908. The memory 202 as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY, JESD235, originally published by JEDEC in October 2013), DDR5 (DDR version 5, currently in discussion by JEDEC), LPDDR5 (currently in discussion by JEDEC), HBM2 (HBM version 2, JESD235a, originally published by JEDEC in January 2016), HBM3 (HBM version 3, currently in discussion by JEDEC), or others or combinations of memory technologies, and technologies based on derivatives or extensions of such specifications.

The other components may include, for example, a display (e.g., touchscreen, flat-panel), a power supply (e.g., a battery or/or other power supply), sensors, power management logic, or other components. The communications interfaces 906 may include logic and/or features to support a communication interface. For these examples, communications interface 906 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 904, which may be the mass storage component of the system. The non-volatile storage 904 includes one or more non-volatile memory (storage) arrays. The non-volatile storage 904 can include a solid state drive (SSD), a dual in-line memory module (DIMM), or other non-volatile storage. Non-volatile storage 904 may include byte or block addressable types of non-volatile memory having a 3-dimensional (3D) cross-point memory structure that includes chalcogenide storage material hereinafter referred to as "3D cross-point memory". Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), Conductive Bridging RAM (CBRAM), or a combination of any of the above. The techniques described herein to adapt the DC bias of voltage regulators for memory devices can be implemented for memory devices (e.g., 902), storage devices (e.g., 904), or both.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A non-volatile memory device comprising:
an array of memory cells;
a plurality of voltage regulators, wherein outputs of the plurality of voltage regulators are tied together to provide a voltage to perform operations on the array;
a register to indicate a mode of the non-volatile memory device; and
logic to enable or disable one or more of the plurality of voltage regulators in response to modification of the register by a memory controller;
wherein after modification of the register by the memory controller, the memory controller is to send requests to the non-volatile memory device at an adjusted bandwidth.

2. The non-volatile memory device of claim 1, wherein:
the modification of the register is to indicate an anticipated change in bandwidth for the non-volatile memory device.

3. The non-volatile memory device of claim 2, wherein:
the anticipated change in bandwidth is for a rank including the non-volatile memory device.

4. The non-volatile memory device of claim 2, wherein:
the anticipated change in bandwidth includes an anticipated change in spacing between commands to be sent to the non-volatile memory device.

5. The non-volatile memory device of claim 1, wherein:
the logic is to: enable one or more of the plurality of voltage regulators in response to a write to the register to indicate a transition to a high power or high bandwidth mode.

6. The non-volatile memory device of claim 1, wherein:
the logic is to: disable one or more of the plurality of voltage regulators in response to a write to the register to indicate a transition to a low power or low bandwidth mode.

7. The non-volatile memory device of claim 1, wherein:
the logic includes:
a decoder to receive the mode from the register and output enable/disable signals to each of the plurality of voltage regulators based on the mode.

8. The non-volatile memory device of claim 1, wherein:
the logic includes:
delay elements on an enable/disable input of each of the plurality of voltage regulators to enable the plurality of voltage regulators to be enabled or disabled one at a time.

9. The non-volatile memory device of claim 8, wherein:
the delay elements are programmable to adjust a delay of enablement/disablement of each of the plurality of voltage regulators.

10. The non-volatile memory device of claim 1, wherein:
the plurality of voltage regulators are identical voltage regulators.

11. The non-volatile memory device of claim 1, wherein:
the array of memory cells comprises a crosspoint memory array including a chalcogenide storage material.

12. A memory module comprising:
input/output (I/O) circuitry to couple with a memory controller;
one or more non-volatile memory dies, each of the non-volatile memory dies including:
an array of memory cells;
a plurality of voltage regulators, wherein outputs of the plurality of voltage regulators are tied together to provide a voltage to perform operations on the array;
a register to indicate a mode of the non-volatile memory die; and
logic to enable or disable one or more of the plurality of voltage regulators in response to modification of the register by a memory controller;
wherein after modification of the register by the memory controller, the memory controller is to send requests to the non-volatile memory die at an adjusted bandwidth.

13. The memory module of claim 12, wherein:
the modification of the register is to indicate an anticipated change in bandwidth for the one or more non-volatile memory dies.

14. The memory module of claim 13, wherein:
the anticipated change in bandwidth is for a bus between the memory controller and a rank including the one or more non-volatile memory dies.

15. A memory controller comprising:
logic to:
determine a bandwidth is to be adjusted for a non-volatile memory device, and
based on the determination the bandwidth is to be adjusted program a register of the non-volatile memory device, the non-volatile memory device to enable or disable one or more of a plurality of voltage regulators based on the register, wherein outputs of the plurality of voltage regulators are tied together to provide a voltage to perform memory access operations; and
input/output (I/O) circuitry to:
send requests to the non-volatile memory device at the adjusted bandwidth.

16. The memory controller of claim 15, wherein
the I/O circuitry is to send the requests to the non-volatile memory device at the adjusted bandwidth after a predetermined delay after programming the register.

17. The memory controller of claim 15, wherein:
the bandwidth adjustment comprises a change of spacing of commands to be sent to the non-volatile memory device.

\* \* \* \* \*